US008264871B2

(12) United States Patent
Katagiri

(10) Patent No.: US 8,264,871 B2
(45) Date of Patent: Sep. 11, 2012

(54) PHASE CHANGE MEMORY DEVICE

(75) Inventor: Satoshi Katagiri, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 1105 days.

(21) Appl. No.: 12/216,271

(22) Filed: Jul. 2, 2008

(65) Prior Publication Data

US 2009/0010049 A1    Jan. 8, 2009

(30) Foreign Application Priority Data

Jul. 4, 2007    (JP) ................ P2007-176044

(51) Int. Cl.
*G11C 11/00* (2006.01)
(52) U.S. Cl. ................ 365/163; 365/148; 977/754
(58) Field of Classification Search .............. 365/46, 365/94, 100, 113, 129, 148, 163; 257/2–5, 257/296, E31.047, E27.006; 438/29, 95, 438/96, 166, 259, 365, 482, 486, 597; 977/754
See application file for complete search history.

(56) References Cited

U.S. PATENT DOCUMENTS

| | | | | |
|---|---|---|---|---|
| 6,667,900 B2 * | 12/2003 | Lowrey et al. | ............... | 365/171 |
| 6,768,665 B2 * | 7/2004 | Parkinson et al. | ............ | 365/113 |
| 6,873,538 B2 | 3/2005 | Hush | | |
| 7,224,599 B2 * | 5/2007 | Sakata et al. | ................ | 365/148 |
| 7,336,526 B2 * | 2/2008 | Osada et al. | .................. | 365/163 |
| 7,420,838 B2 * | 9/2008 | Osada et al. | .................. | 365/163 |
| 2003/0123284 A1 * | 7/2003 | Lowrey et al. | ............... | 365/175 |
| 2006/0072370 A1 * | 4/2006 | Kuh et al. | .................... | 365/232 |
| 2006/0146634 A1 * | 7/2006 | Osada et al. | .................. | 365/226 |
| 2007/0014150 A1 | 1/2007 | Cho et al. | | |
| 2007/0195582 A1 * | 8/2007 | Sakata et al. | ................ | 365/148 |
| 2007/0297221 A1 * | 12/2007 | Philipp et al. | ................ | 365/163 |
| 2008/0025066 A1 * | 1/2008 | Fasoli et al. | ................. | 365/148 |
| 2008/0025132 A1 * | 1/2008 | Fasoli et al. | ............. | 365/230.06 |
| 2008/0285336 A1 * | 11/2008 | Osada et al. | .................. | 365/163 |

FOREIGN PATENT DOCUMENTS

| | | |
|---|---|---|
| JP | 2005-514719 A | 5/2005 |
| JP | 2007-026644 A | 2/2007 |
| WO | WO 03/054887 A1 | 7/2003 |

\* cited by examiner

*Primary Examiner* — Alexander Sofocleous
*Assistant Examiner* — Harry W Byrne
(74) *Attorney, Agent, or Firm* — Foley & Lardner LLP

(57) ABSTRACT

A phase change memory device is constituted of a plurality of memory cells including a plurality of phase change memory elements, which are arranged at intersecting points formed between a plurality of word lines and a plurality of bit lines. A write circuit which operates based on a write voltage source (Vwrite) is controlled by control signals (e.g. WE, RDIS, SDIS, and DIN) output from a control circuit which operates based on a voltage source (VDD), where Vwrite>VDD. All the control signals based on VDD are applied to the gates of N-channel MOS transistors included in the write circuit. This allows adequately high write currents to be supplied to phase change memory elements; and this eliminates the necessity of arranging a potential switch circuit in the write circuit, thus reducing the scale of the phase change memory device.

17 Claims, 5 Drawing Sheets

PHASE CHANGE MEMORY DEVICE

BACKGROUND OF THE INVENTION

1. Field of the Invention

The present invention relates to phase change memory devices composed using phase change materials such as chalcogenide.

The present application claims priority on Japanese Patent Application No. 2007-176044, the content of which is incorporated herein by reference.

2. Description of the Related Art

Conventionally, dynamic random-access memories (DRAM) have been currently used in various electronic devices; however, they are volatile memories that cannot store data without a power supply. They are disadvantageous in that refreshing is required to hold data during power supply.

A nonvolatile memory has been conventionally known to solve drawbacks of a volatile memory. A flash memory is known as a typical example of a nonvolatile memory. Compared with DRAM, it has a problem due to restrictions in which it needs a relatively long time for writing and erasing data and a relatively high consumption of electric current.

Recently, phase change random-access memory (PRAM) composed using phase change materials such as chalcogenide has been developed as a new type of nonvolatile memory. In the PRAM (simply referred to as phase change memory), different write currents are applied to phase change materials, which are thus varied in crystalline states so as to store data. The PRAM can be used as a nonvolatile memory and will be expected as a promising replacement for the conventionally-known DRAM because it does not need refreshing to hold data.

A write circuit of the conventionally-known phase change memory device needs an electric current of several hundreds of micro-amperes (μA) in order to write data into memory cells. It is very difficult to adequately produce such a high write current based on the existing voltage supply; hence, it is necessary to use a high potential power source, which produces a high write current by way of a potential switch circuit. The potential switch circuit is a complex circuit having a relatively large scale of circuitry, thus increasing the overall scale of circuitry of the phase change memory device.

Various types of phase change memory devices have been disclosed in various documents such as Patent Document 1 and Patent Document 2.

Patent Document 1: Japanese Unexamined Patent Application Publication No. 2007-26644

Patent Document 2: Japanese Patent Application Publication No. 2005-514719

Patent Document 1 teaches a phase change memory device capable of changing a drive voltage level thereof, which includes a write booster circuit and a write driver. In a first mode, the write booster circuit boosts a first voltage to produce a first control voltage in response to a control signal. In a second mode or a third mode, it boosts the first voltage to produce a second control voltage in response to the control signal.

Patent Document 2 teaches a programmable conductor random-access memory (PCRAM), to which an adequate voltage is applied so as to write data into chalcogenide memory cells by setting prescribed resistances thereto.

Both of Patent Document 1 and Patent Document 2 differ from the present invention in terms of the object and constitution because the present invention aims at a reduction of the scale of circuitry by eliminating the potential switch circuit in the write circuit for writing data into phase change memory cells.

SUMMARY OF THE INVENTION

It is an object of the present invention to provide a phase change memory device, the scale of circuitry of which is reduced by eliminating a potential switch circuit in a write circuit for writing data into phase change memory cells.

A phase change memory device of the present invention is constituted of a plurality of memory cells including a plurality of phase change memory elements, which are arranged at intersecting points formed between a plurality of bit lines and a plurality of word lines, and which are varied in resistances thereof by controlling write currents flowing therethrough so as to store a plurality of data therein.

In a first aspect of the present invention, the phase change memory device includes a write circuit for applying write currents to the memory cells so as to store data therein, and a control circuit for supplying a plurality of control signals to the write circuit, which is thus controlled in the write operation. The control circuit operates based on a first voltage (VDD) which is higher than a second voltage (Vwrite) applied to the write circuit, where Vwrite>VDD. In addition, the write circuit includes a plurality of N-channel MOS transistors for receiving control signals output from the control circuit.

Since the first voltage applied to the control circuit differs from the second voltage applied to the write circuit (where Vwrite>VDD), it is possible to supply phase change memory elements with adequately high write currents. All the control signals (e.g. the write enable signal WE) are supplied to the gates of the N-channel MOS transistor in the write circuit based on the first voltage. Thus, it is unnecessary to arrange a potential switch circuit inside of the write circuit; hence, it is possible to reduce the scale of the phase change memory device.

In the above, the write circuit includes a first P-channel MOS transistor (Q1) for performing a reset write operation on the phase change memory element, a second P-channel MOS transistor (Q2) for performing a set write operation on the phase change memory element, a first transfer gate (TG1) for turning on the first P-channel MOS transistor, a second transfer gate (TG2) for turning on the second P-channel MOS transistor, a first latch circuit (L1) for selectively turning on either the first transfer gate or the second transfer gate, a second latch circuit (L2) for selectively turning on the first P-channel MOS transistor or the second P-channel MOS transistor by way of either the first transfer gate or the second transfer gate. Herein, the control circuit controls the first latch circuit and the second latch circuit with control signals, thus selectively turning on either the first P-channel MOS transistor or the second P-channel MOS transistor.

This eliminates the necessity of arranging the potential switch circuit inside of the write circuit, the scale of which is thus reduced. Due to the simple circuit configuration and simple control method, it is possible to perform either the reset write operation or the set write operation on the phase change memory element via either the first P-channel MOS transistor or the second P-channel MOS transistor, which serves as a write driver transistor.

When the write circuit receives a pulse of the write enable signal (WE) so as to perform the reset write operation, the first latch circuit turns on the first transfer gate while turning off the second transfer gate, and the second latch circuit turns on the first P-channel MOS transistor via the first transfer gate.

When the write circuit receives a reset disable signal (RDIS) for ending the reset write operation, the second latch circuit turns off the first P-channel MOS transistor via the first transfer gate.

Alternatively, when the write circuit receives a pulse of the write enable signal (WE) so as to perform the set write operation, the first latch circuit turns off the first transfer gate while turning on the second transfer gate, and the second latch circuit turns on the second P-channel MOS transistor via the second transfer gate. When the write circuit receives a set disable signal (SDIS) for ending the set write operation, the second latch circuit turns off the second P-channel MOS transistor via the second transfer gate.

In a second aspect of the present invention, the write circuit of the phase change memory device includes a first P-channel MOS transistor (Q1) for performing a reset write operation on the phase change memory element, a second P-channel MOS transistor (Q2) for performing a set write operation on the phase change memory element, a first clocked inverter (CINV1) for turning on the first P-channel MOS transistor, a second clocked inverter (CINV2) for turning on the second P-channel MOS transistor, a first latch circuit (L1) for selectively turning on either the first clocked inverter or the second clocked inverter, a second latch circuit (L2) for selectively turning on the first P-channel MOS transistor or the second P-channel MOS transistor by way of either the first clocked inverter or the second clocked inverter. Herein, the control circuit controls the first latch circuit and the second latch circuit with control signals, thus selectively turning on either the first P-channel MOS transistor or the second P-channel MOS transistor.

In the above, when the write circuit receives a pulse of the write enable signal (WE) so as to perform the reset write operation, the first latch circuit turns on the first clocked inverter while turning off the second clocked inverter, and the second latch circuit turns on the first P-channel MOS transistor via the first clocked inverter. When the write circuit receives a reset disable signal (RDIS) for ending the reset write operation, the second latch circuit turns off the first P-channel MOS transistor via the first clocked inverter.

Alternatively, when the write circuit receives a pulse of the write enable signal (WE) so as to perform the set write operation, the first latch circuit turns off the first clocked inverter while turning on the second clocked inverter, and the second latch circuit turns on the second P-channel MOS transistor via the second clocked inverter. When the write circuit receives a set disable signal (SDIS) for ending the set write operation, the second latch circuit turns off the second P-channel MOS transistor via the second clocked inverter.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

The present invention will be described in further detail by way of examples with reference to the accompanying drawings.

1. First Embodiment

Figure 1:
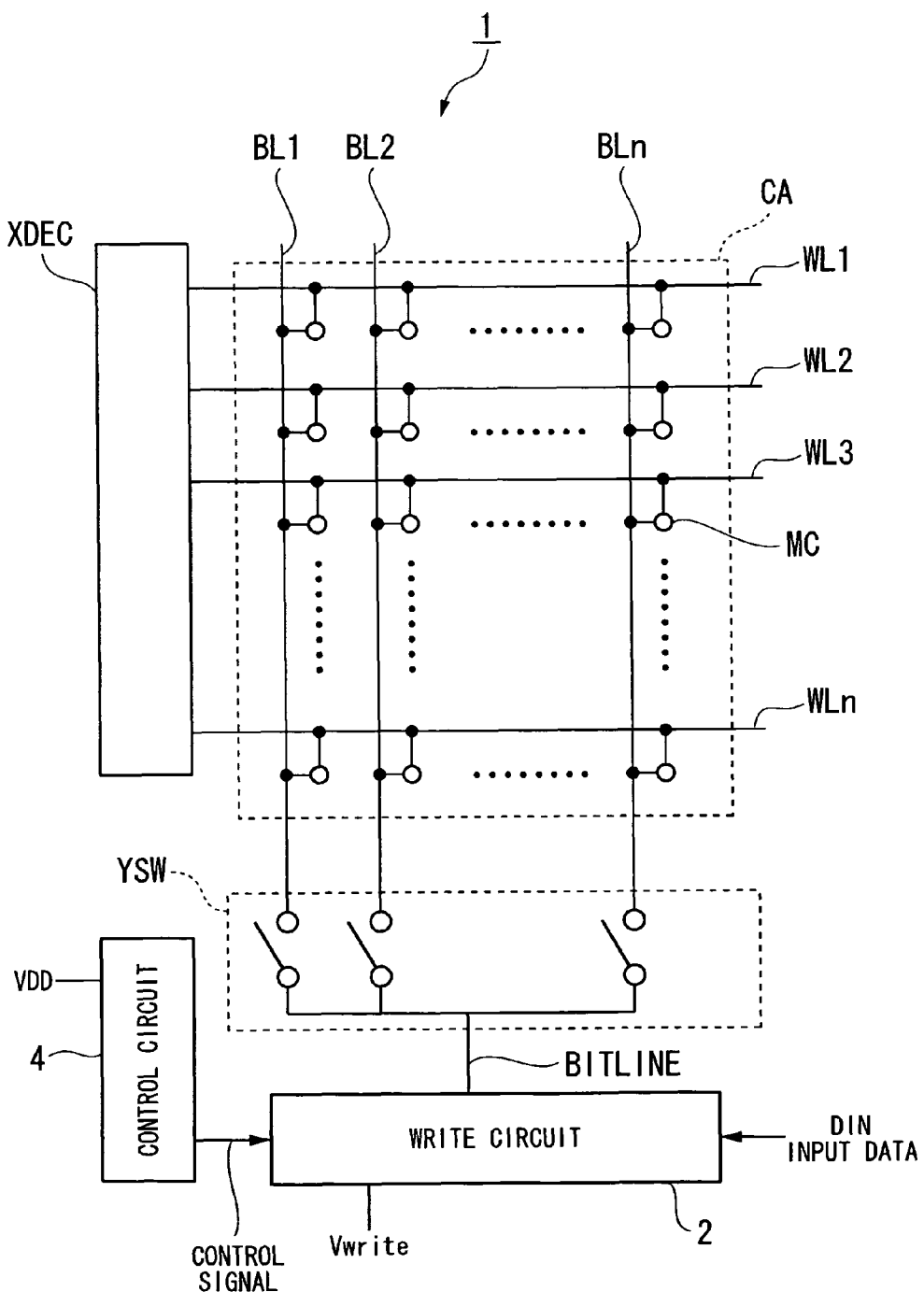
FIG. 1 is a block diagram showing the constitution of a phase change memory device connected to a write circuit in accordance with a first embodiment of the present invention.

FIG. 1 shows the constitution of a phase change memory device 1 connected to a write circuit 2 in accordance with a first embodiment of the present invention.

The phase change memory device 1 includes a memory cell array CA, in which a plurality of word lines WL (i.e. WL1, WL2, WL3, . . . , WLn, where n is an integer) intersect a plurality of bit lines BL (i.e. BL1, BL2, . . . , BLn) in a matrix manner so as to arrange a plurality of memory cells MC (including phase change memory elements) at intersecting points therebetween.

One of the word lines WL is selected by a row decoder XDEC. The bit lines BL are connected to a Y switch YSW, so that one of them is selectively connected to the write circuit 2 via a bit select line BITLINE.

The phase change memory device 1 is controlled by a control circuit 4, which is driven by a voltage source VDD. The control circuit 4 supplies the write circuit 2 with a control signal, which substantially matches a level of the voltage source VDD. The write circuit 2 is driven by a write voltage source Vwrite. The level of the voltage source VDD (adapted to the control circuit 4) differs from the level of the write voltage source Vwrite (adapted to the write circuit 2). That is, the level of the write voltage source Vwrite is higher than the level of the voltage source VDD (where Vwrite>VDD). This is because an adequate write current is required for writing data into the memory cells MC. Since the write circuit 2 is driven based on the write voltage source Vwrite, it is unnecessary to arrange a potential switch circuit inside of the write circuit 2.

Figure 2:
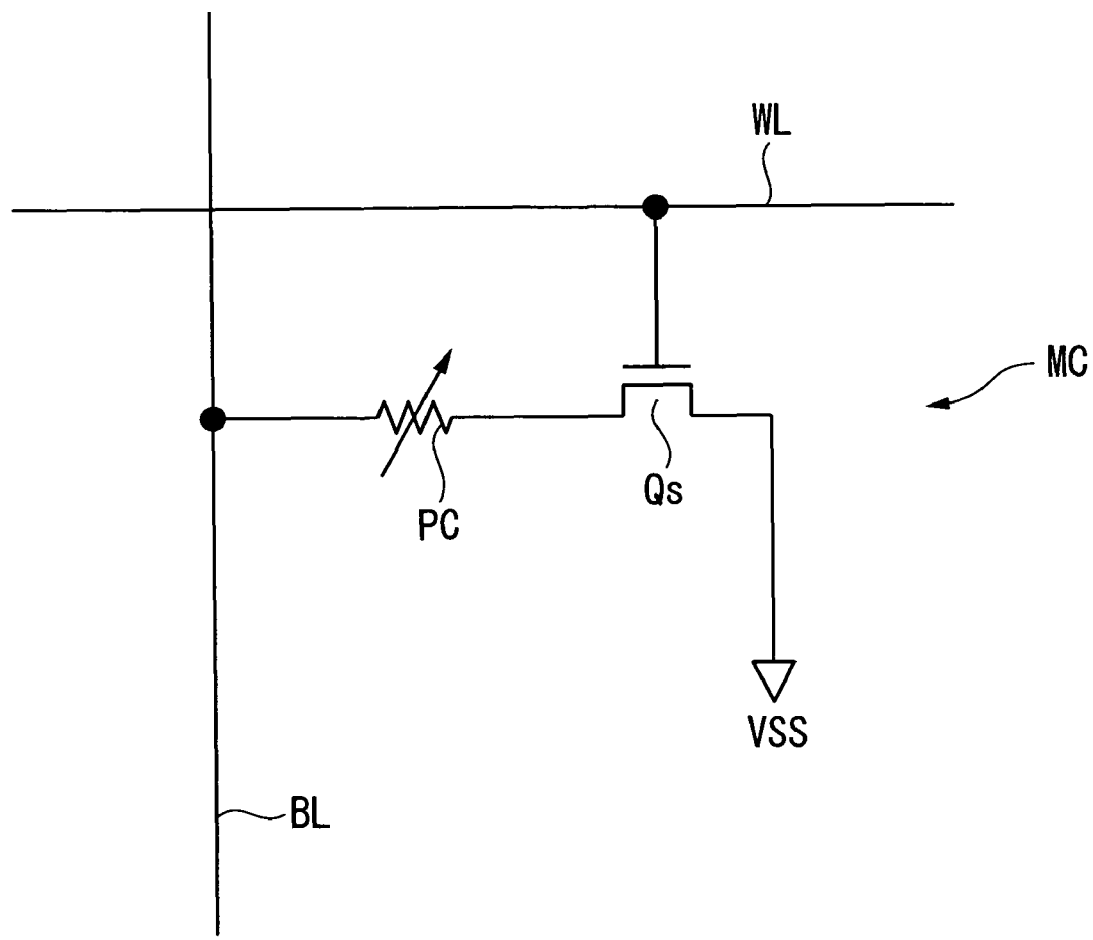
FIG. 2 is a circuit diagram showing the constitution of a memory cell including a phase change memory element, which is arranged in a memory cell array of the phase change memory device.

FIG. 2 is a circuit diagram showing the constitution of the memory cell MC, which is constituted of a phase change memory element PC and a cell transistor Qs (using an N-channel MOS transistor). The phase change memory element PC is connected between the bit line BL and the drain of the cell transistor Qs. The gate of the cell transistor Qs is connected to the word line WL, and the source thereof is connected to a ground level VSS.

The phase change memory element PC is composed of a phase change material such as chalcogenide, which is a compound composed of at least one of germanium (Ge), antimony (Sb), tellurium (Te), indium (In), and selenium (Se).

An electric current is applied to the phase change memory element PC, which is thus heated and set to either an amorphous state (i.e. RESET) or a crystalline state (i.e. SET). That is, the phase change memory element PC has a high resistance in the amorphous state (RESET), while it has a low resistance in the crystalline state (SET).

Figure 3:
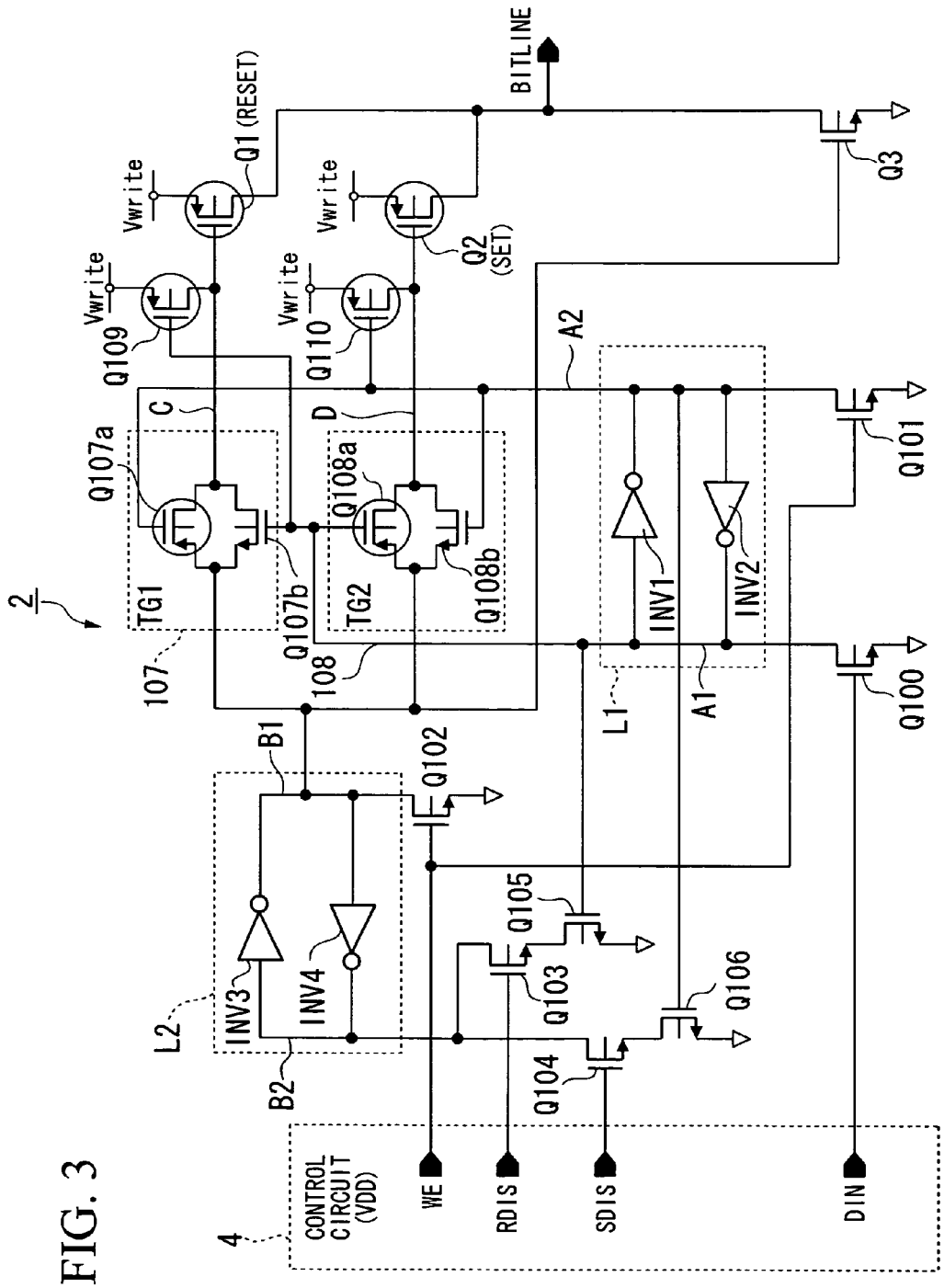
FIG. 3 is a circuit diagram showing the constitution of the write circuit according to the first embodiment.

FIG. 3 shows the constitution of the write circuit 2 connected to the phase change memory device 1 in accordance with the first embodiment.

The write circuit 2 includes a latch circuit L1 constituted of inverters (or logical inversion gates) INV1 and INV2, a latch circuit L2 constituted of inverters INV3 and INV4, a P-channel MOS transistor (or a P-channel MOS FET) Q1 (used for writing reset data into the memory cell MC), a P-channel transistor Q2 (used for writing set data into the memory cell MC), and an N-channel MOS transistor (or an N-channel MOS FET) Q3 (used for deactivating the bit select line BITLINE). The P-channel MOS transistors Q1 and Q2 may be called write driver transistors.

The write circuit 2 also includes N-channel MOS transistors Q100 to Q106 (used for controlling latch data of the latch circuits L1 and L2), a transfer gate 107 (i.e. a transfer gate TG1 constituted of a P-channel MOS transistor Q107a and an N-channel MOS transistor Q107b), which is used to select the P-channel MOS transistor Q1 (used for writing reset data into the memory cell MC), a transfer gate 108 (i.e. a transfer gate TG2 constituted of a P-channel MOS transistor Q108a and an N-channel MOS transistor Q108b), which is used to select the P-channel MOS transistor Q2 (used for writing set data into the memory cell MC), and P-channel MOS transistors Q109 and Q110, which are used to deactivate the P-channel MOS transistors Q1 and Q2.

As described above, the write circuit 2 is connected to the write voltage source Vwrite supplying write voltages to various components thereof. The level of the write voltage source Vwrite is higher than the level of the voltage source VDD (which supplies voltages to the control circuit 4 and the like other than the write circuit 2), where Vwrite>VDD.

A terminal A1 of the latch circuit L1 is connected to the drain of the N-channel MOS transistor 100, the gate of the N-channel MOS transistor Q105, the gate of the N-channel MOS transistor Q107b (included in the transfer gate 107, i.e. TG1), the gate of the P-channel MOS transistor Q108a (included in the transfer gate 108, i.e. TG2), and the gate of the P-channel transistor Q109.

A terminal A2 of the latch circuit L1 is connected to the drain of the N-channel MOS transistor Q101, the gate of the N-channel MOS transistor Q106, the gate of the P-channel MOS transistor Q107a (included in the transfer gate 107, i.e. TG1), the gate of the N-channel MOS transistor Q108b (included in the transfer gate 108, i.e. TG2), and the gate of the P-channel MOS transistor Q110.

An output terminal C of the transfer gate 107 (or TG1) is connected to the gate of the P-channel MOS transistor Q1 and the drain of the P-channel MOS transistor Q109. Both the sources of the MOS transistors Q1 and Q109 are connected to the write voltage source Vwrite. An output terminal D of the transfer gate 108 (or TG2) is connected to the gate of the P-channel MOS transistor Q2 and the drain of the P-channel MOS transistor Q110. Both the sources of the MOS transistors Q2 and Q110 are connected to the write voltage source Vwrite.

A terminal B1 of the latch circuit L2 is connected to the drain of the N-channel MOS transistor Q102, input terminals of the transfer gates 107 and 108, and the gate of the N-channel MOS transistor Q3. A terminal B2 of the latch circuit L2 is connected to the drain of the N-channel MOS transistor Q103 and the drain of the N-channel MOS transistor Q104.

A write enable signal WE (supplied by an external device, not shown) is supplied to the gates of the N-channel MOS transistors Q101 and Q102. A reset disable signal RDIS is supplied to the gate of the N-channel MOS transistor Q103 whose source is connected to the drain of the N-channel MOS transistor Q104. A set disable signal SDIS is supplied to the gate of the N-channel MOS transistor Q104 whose source is connected to the drain of the N-channel MOS transistor Q106. Input data DIN is supplied to the gate of the N-channel MOS transistor Q100.

Both the drains of the P-channel MOS transistors Q1 and Q2 are connected to the bit select line BITLINE, which is also connected to the drain of the N-channel MOS transistor Q3.

In the aforementioned structure, the write voltage source Vwrite is connected in series to the selected memory cell MC via the P-channel MOS transistors Q1 and Q2 (for writing set/reset data into the memory cell MC), the bit select line BITLINE, and the Y switch YSW (see FIG. 1), thus supplying the phase change memory cell PC with an adequate current in writing.

As described above, the control circuit 4 operates based on the voltage source VDD, while the write circuit 2 operates based on the write voltage source Vwrite. In claim language, the P-channel MOS transistor Q1 serves as a first P-channel MOS transistor, and the P-channel MOS transistor Q2 serves as a second P-channel MOS transistor. In addition, the transfer gate 107 (or TG1) serves as a first transfer gate, and the transfer gate 108 (or TG2) serves as a second transfer gate. Furthermore, the latch circuit L1 serves as a first latch circuit, and the latch circuit L2 serves as a second latch circuit.

Figure 4:
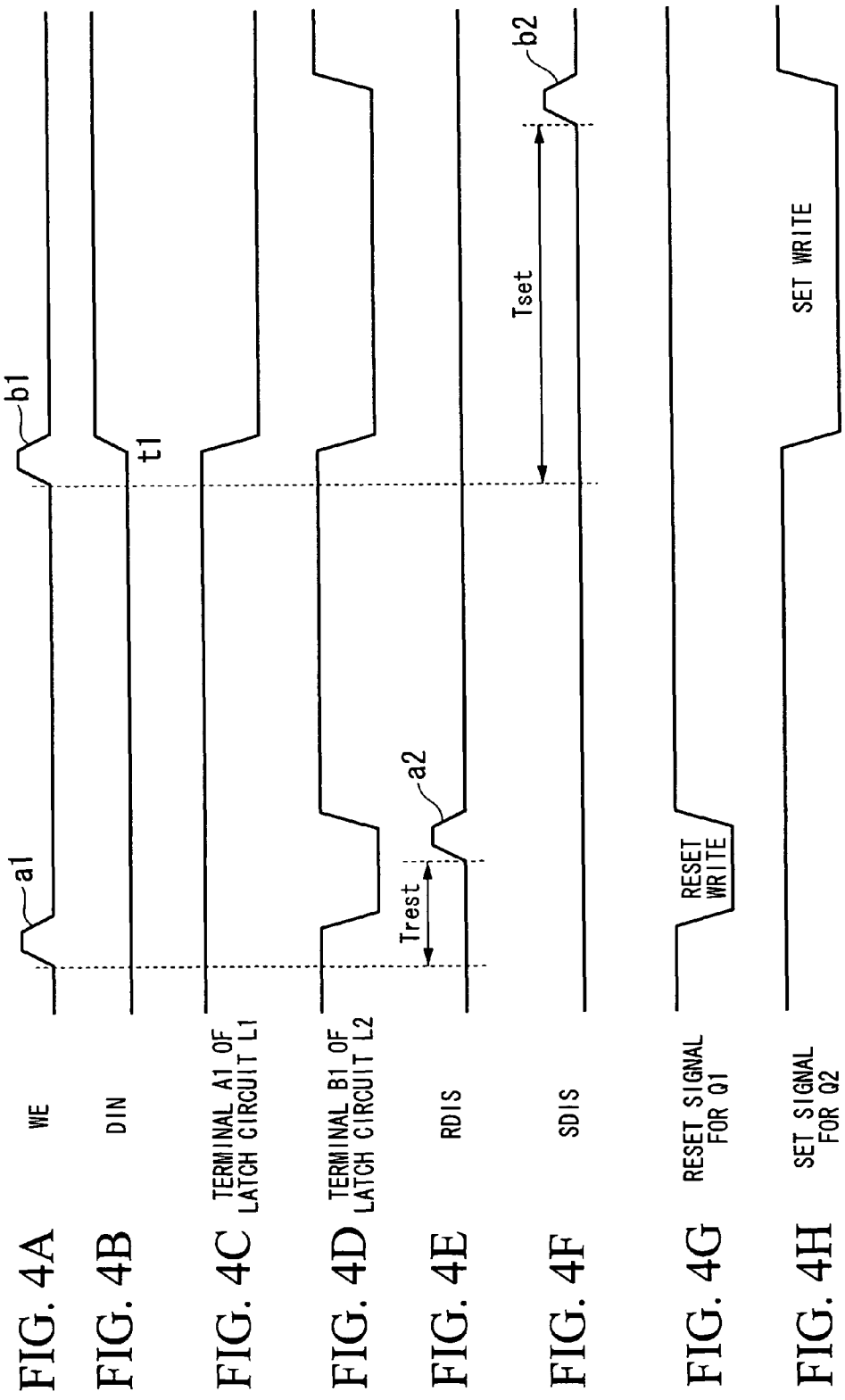
FIG. 4A is a time chart of a write enable signal WE supplied to the write circuit of FIG. 3.
FIG. 4B is a time chart of input data DIN supplied to the write circuit of FIG. 3.
FIG. 4C is a time chart of latch data of a latch circuit L1 included in the write circuit of FIG. 3.
FIG. 4D is a time chart of latch data of a latch circuit L2 included in the write circuit of FIG. 3.
FIG. 4E is a time chart of a reset disable signal RDIS supplied to the write circuit of FIG. 3.
FIG. 4F is a time chart of a set disable signal SDIS supplied to the write circuit of FIG. 3.
FIG. 4G is a time chart of a reset signal supplied to the gate of a P-channel MOS transistor Q1 included in the write circuit of FIG. 3.
FIG. 4H is a time chart of a set signal supplied to the gate of a P-channel MOS transistor Q2 included in the write circuit of FIG. 3.

Next, the operation of the write circuit 2 will be described with reference to FIGS. 4A to 4I, wherein FIG. 4A shows the write enable signal WE, FIG. 4B shows the input data DIN, FIG. 4C shows the latch data applied to the terminal A1 of the latch circuit L1, FIG. 4D shows the latch data applied to the terminal B1 of the latch circuit L2, FIG. 4E shows the reset disable signal RDIS supplied to the write circuit 2, FIG. 4F shows the set disable signal SDIS supplied to the write circuit 2, FIG. 4G shows a reset signal (at the output terminal C of the transfer gate 107) supplied to the gate of the P-channel MOS transistor Q1, and FIG. 4H shows a set signal (at the output terminal D of the transfer gate 108) supplied to the gate of the P-channel MOS transistor Q2.

First, the reset operation of the write circuit 2 will be described in detail, wherein logic 0 represents a low level, while logic 1 represents a high level.

The write operation is started such that the N-channel MOS transistor Q101 is turned on in response to a pulse a1 of the write enable signal WE, so that the terminal A2 of the latch circuit L1 is set to logic 0, while the terminal A1 of the latch circuit L1 is set to logic 1 (see FIG. 4C). The N-channel MOS transistor Q102 is turned on in response to the pulse a1 of the write enable signal WE, so that the terminal B1 of the latch circuit L2 is set to logic 0.

In response to the logic 1 set to the terminal A1 of the latch circuit L1, the N-channel MOS transistor Q107b of the transfer gate 107 (used for activating the P-channel MOS transistor Q1) is turned on, so that the output terminal C is set to logic 0 similar to the terminal B1. Thus, as shown in FIG. 4G, the write circuit 2 starts a reset write operation by way of the P-channel MOS transistor Q1, which is currently turned on.

In the reset write operation, the N-channel MOS transistor Q108b of the transfer gate 108 (used for activating the P-channel MOS transistor Q2) is turned off due to logic 0 set to the terminal A2, while the P-channel MOS transistor Q110 (used for deactivating the P-channel MOS transistor Q2) is turned on, so that the output terminal D is set to logic 1, thus deactivating the P-channel MOS transistor Q2.

When a prescribed time Treset elapses after the reset write operation (which is started by the pulse a1 of the write enable signal WE), a pulse a2 appears in the reset disable signal RDIS.

Since the terminal A1 is set to logic 1, the N-channel MOS transistor Q105 is turned on while the N-channel MOS transistor Q103 is turned on in response to the pulse a2 of the reset disable signal RDIS; that is, both the N-channel MOS transistors Q103 and Q105 are turned on. In this case, the terminal B1 of the latch circuit L2 is set to logic 1 while the terminal B2 is set to logic 0 (see FIG. 4D).

In the above, the transfer gate 107 turns on the P-channel MOS transistor Q1 but the output terminal C of the transfer gate 107 is set to logic 1, so that it turns off the P-channel MOS transistor Q1 so as to end the reset write operation in response to the pulse a2 of the reset disable signal RDIS (see FIG. 4G).

In the above, both the write enable signal WE and the reset disable signal RDIS are substantially set to the same level, i.e. the level of the voltage source VDD (adapted to the control circuit 4), while the write circuit 2 operates based on the write voltage source Vwrite. The write circuit 2 restrictively uses the N-channel MOS transistors for inputting signals given from an external device (not shown), so that no operational error occurs. In other words, the write circuit 2 is not affected by the difference between the voltage source VDD and the write voltage source Vwrite.

Next, a set write operation of the write circuit 2 will be described in detail. First, the terminal A1 of the latch circuit L1 is set to logic 1 in response to a pulse b1 of the write enable signal WE, while the terminal B1 of the latch circuit L2 is set to logic 0.

At this state, logic 1 is set to the input data DIN at time t1 as shown in FIG. 4B; hence, the N-channel MOS transistor Q100 is turned on so that the terminal A1 of the latch circuit L1 is set to logic 0, while the terminal A2 is set to logic 1. That is, the N-channel MOS transistor Q108b of the transfer gate 108 is turned on, so that the output terminal D is set to logic 0, similar to the terminal B1 (see FIG. 4H).

Therefore, the transfer gate 108 turns on the P-channel MOS transistor Q2 so as to start the set write operation. In contrast, the transfer gate 107 turns off the P-channel MOS transistor Q1, while the P-channel MOS transistor Q109 is turned on so that the output terminal C is set to logic 1. Thus, the P-channel MOS transistor Q1 (used for performing the reset write operation) is turned off.

When a prescribed time Tset elapses from the pulse b1 of the write enable signal WE for starting the set write operation, a pulse b2 appears in the set disable signal SDIS (see FIG. 4F). The time Tset is longer than the time Treset (where Tset>Treset). This varies the time period for applying the phase change memory element PC, thus establishing a distinction between the reset write operation and the set write operation.

The terminal A2 of the latch circuit L1 is set to logic 1 in response to the pulse b2 of the set disable signal SDIS so that the N-channel MOS transistor Q106 is turned on, while the N-channel MOS transistor Q104 is turned on in response to the pulse b2 of the set disable signal SDIS; that is, both the N-channel MOS transistors Q104 and Q106 are turned on.

Thus, the terminal B2 of the latch circuit L2 is set to logic 0, while the terminal B1 is set to logic 1.

In the above, the transfer gate 108 turns on the P-channel MOS transistor Q2 but the output terminal D1 is set to logic 1 in response to the pulse b2 of the set disable signal SDIS (see FIG. 4D); hence, the P-channel MOS transistor Q2 is turned off, thus ending the set write operation (see FIG. 4H).

In this connection, both the write enable signal WE and the reset disable signal RDIS are substantially set to the same level, i.e. the level of the voltage source VDD, while the write circuit 2 operates based on the write voltage source Vwrite. The write circuit 2 restrictively uses the N-channel MOS transistors for inputting signals from the external device; hence, no operational error occurs. That is, the write circuit 2 is not affected by the difference between the voltage source VDD and the write voltage source Vwrite.

In the phase change memory device 1 of the first embodiment, the write voltage source Vwrite (adapted to the write circuit 2) is higher than the voltage source VDD (adapted to the control circuit 4), where Vwrite>VDD. This allows the write circuit 2 to supply adequate currents to the phase change memory elements PC of the memory cells MC. In addition, all the signals output from the control circuit 4 are received by the N-channel MOS transistors of the write circuit 2, wherein all the input signals (e.g. the write enable signal WE) of the write circuit are substantially set identical to the level of the voltage source VDD adapted to the control circuit 4. This eliminates the necessity of incorporating a potential switch circuit in the write circuit 2; hence, it is possible to reduce the scale of the write circuit 2.

In addition, the latch circuits L1 and L2 are controlled by input signals given from the external device so as to selectively drive the P-channel MOS transistor Q1 or Q2 by means of the transfer gates 107 or 108. That is, the write circuit 2 is designed based on a simple circuit configuration and simple control method which allows reset currents and set currents to be supplied to the phase change memory elements PC via the P-channel MOS transistors Q1 and Q2 (serving as write driver transistors).

2. Second Embodiment

Figure 5:
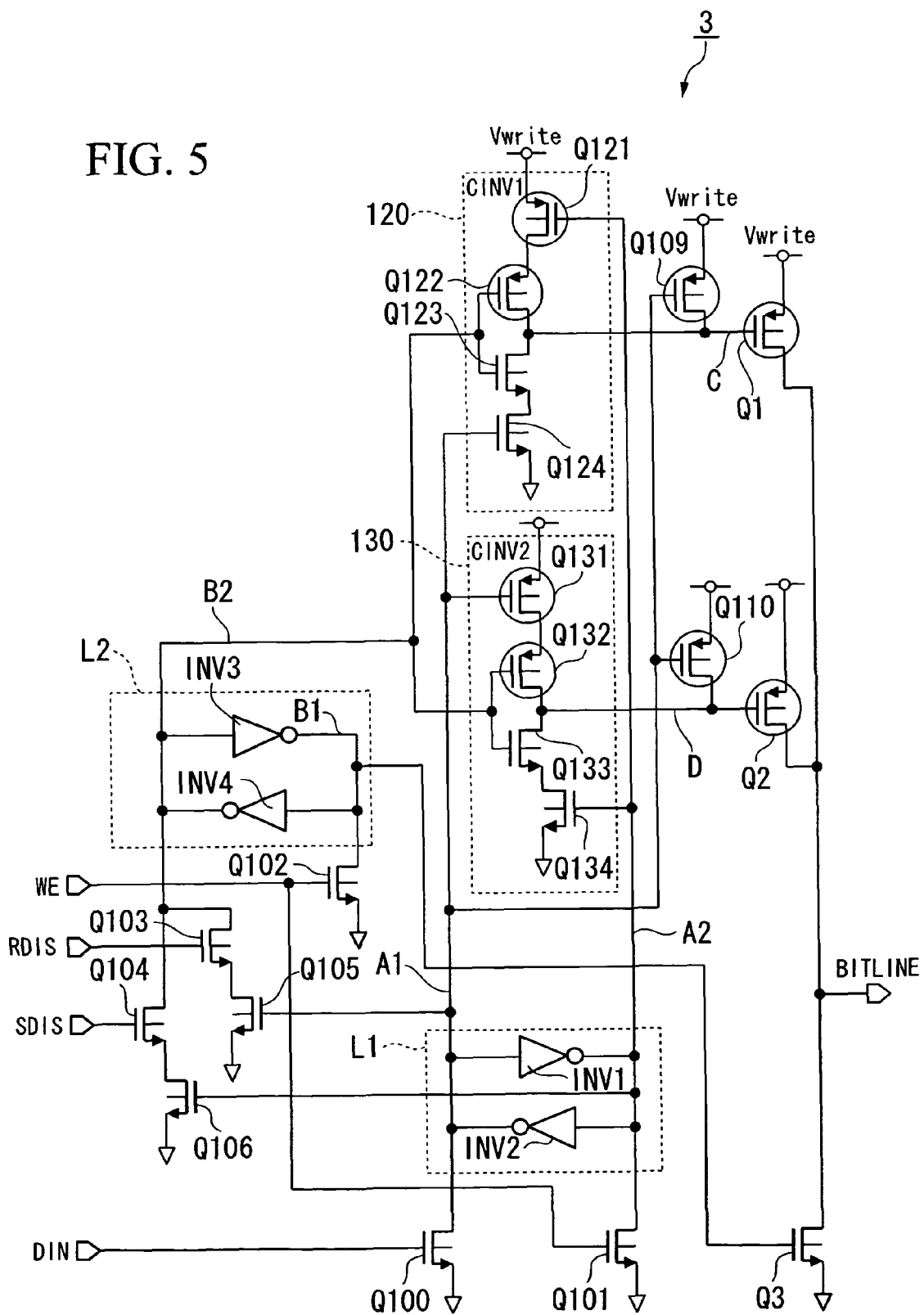
FIG. 5 is a circuit diagram showing the constitution of a write circuit adapted to the phase change memory device in accordance with a second embodiment of the present invention.

Next, a second embodiment of the present invention will be described in conjunction with the phase change memory device 1, which is connected to a write circuit 3. FIG. 5 shows the constitution of the write circuit 3, wherein parts identical to those shown in FIG. 3 are designated by the same reference numerals.

Similar to the write circuit 2 of FIG. 3, the write circuit 3 of FIG. 5 includes the latch circuits L1 and L2, the P-channel MOS transistors Q1 and Q2, the N-channel MOS transistor Q3, the N-channel MOS transistors Q100 to Q106, and the P-channel MOS transistors Q109 and Q110. In addition, the write circuit 3 includes a clocked inverter 120 (referred to as CINV1) for activating the P-channel MOS transistor Q1 (for use in the reset write operation) and a clocked inverter 130 (referred to as CINV2) for activating the P-channel MOS transistor Q2 (for use in the set write operation).

The P-channel MOS transistors Q1 and Q2 are connected in series to the selected memory cell MC via the bit select line BITLINE and the Y switch YSW, thus supplying an adequate write current to the phase change memory element PC.

The write circuit 3 of the second embodiment differs from the write circuit 2 of the first embodiment in that the clocked inverters 120 and 130 are substituted for the transfer gates 107 and 108; hence, they are substantially similar to each other in terms of other circuit components; hence, the detailed descriptions thereof will be omitted.

Compared with the write circuit 2, the write circuit 3 is configured using the clocked inverters 120 and 130 instead of the transfer gates 107 and 108; hence, the operation of the write circuit 3 is basically identical to the operation of the write circuit 2. The following description is given with respect to the clocked inverters 120 and 130 of the write circuit 3.

The clocked inverter 120 is constituted of P-channel MOS transistors Q121 and Q122 and N-channel MOS transistors Q123 and Q124, which are connected in series.

In the reset write time Trest between the pulse a1 of the write enable signal WE (see FIG. 4A) and the pulse a2 of the reset disable signal RDIS (see FIG. 4E), the terminal A2 of the latch circuit L1 is set to logic 0, which is applied to the gate of the P-channel MOS transistor Q121, while the terminal A is set to logic 1, which is applied to the gate of the N-channel MOS transistor Q124; that is, both the MOS transistors Q121 and Q124 are turned on, so that the MOS transistors Q122 and Q123 serve as inverters. At this time, the terminal B2 of the latch circuit L2 is set to logic 1, which is applied to the gates of the MOS transistors Q122 and Q123, so that the output terminal C of the clocked inverter 120 (connected to the gate of the P-channel MOS transistor Q1) is set to logic 0, thus turning on the P-channel MOS transistor Q1. Thus, the reset write operation is performed via the P-channel MOS transistor Q1.

After completion of the reset write operation, the terminal B2 of the latch circuit L2 is set to logic 1, which is applied to the gates of the MOS transistors Q122 and Q123, so that the output terminal C is set to logic 1, thus turning off the P-channel MOS transistor Q1 while turning on the MOS transistor Q109.

The clocked inverter 130 is constituted of P-channel MOS transistors Q131 and Q132 and N-channel MOS transistors Q133 and Q134, which are connected in series.

In the set write time Tset between the pulse b1 of the write enable signal WE (by which the input data DIN is set to logic 1, see FIG. 4B) and the pulse b2 of the set disable signal SDIS (see FIG. 4F), the terminal A1 of the latch circuit L1 is set to logic 0, which is applied to the gate of the P-channel MOS transistor Q131, while the terminal A2 is set to logic 1, which is applied to the gate of the N-channel MOS transistor Q134; that is, both the MOS transistors Q131 and Q134 are turned on so that the MOS transistors Q132 and Q133 serve as inverters. At this time, the terminal B2 of the latch circuit L2 is set to logic 1, which is applied to the gates of the MOS transistors Q132 and Q133, so that the output terminal D of the clocked inverter 130 (connected to the gate of the P-channel MOS transistor Q2) is set to logic 0, thus turning on the P-channel MOS transistor Q2. Thus, the set write operation is performed via the P-channel MOS transistor Q2.

After completion of the set write operation, the terminal B2 of the latch circuit L2 is set to logic 0, which is applied to the gates of the MOS transistors Q132 and Q133, so that the output terminal D of the clocked inverter 130 is set to logic 1, thus turning off the P-channel MOS transistor Q2.

As described above, the clocked inverters 120 and 130 are used to generate appropriate input signals for the gates of the P-channel MOS transistors Q1 and Q2, thus stabilizing the gate potentials at the terminals C and D.

In the claim language, the clocked inverter 120 (or CINV1) serves as a first clocked inverter, and the clocked inverter 130 (or CINV2) serves as a second clocked inverter.

As described heretofore, the phase change memory device 1 of the present invention does not need the potential switch circuit, which has a relatively large scale of circuitry and a complex circuit configuration. Thus, it is possible to reduce the scale of the phase change memory device, which is thus manufactured with low cost.

Lastly, the present invention is not necessarily limited to the first and second embodiments, which can be further modified in a variety of ways within the scope of the invention as defined in the appended claims.

What is claimed is:

1. A device comprising:
a memory cell array including a plurality of word lines, a plurality of bit lines intersecting the word lines, and a plurality of memory cells each disposed at an associated one of intersections of the word and bit lines;
a switch circuit including a first terminal and a plurality of second terminals each coupled to an associated one of the bit lines, the switch circuit being configured to form an electrical path between the first terminal and a selected one of the second terminals;
a write circuit configured to write data into a selected one of the memory cells through the switch circuit, the write circuit comprising,
a first potential line supplied with a first potential voltage,
a second potential line supplied with a second potential voltage,
a first transistor coupled between the first potential line and the first terminal of the switch circuit,
a first latch circuit including first and second input/output nodes,
a second transistor coupled between the first input/output nodes of the first latch circuit and the second potential line,
a third transistor coupled between the second input/output node of the first latch circuit and the second potential line,
a second latch circuit including third and fourth input/output nodes,
a fourth transistor coupled between the third input/output node of the second latch circuit and the second potential line,
fifth and sixth transistors coupled in series between the fourth input/output node of the second latch circuit and the second potential line, a control electrode of the fifth transistor being coupled to the first input/output node of the first latch circuit, and
a first gate circuit including a first input node coupled to the third input/output node of the second latch circuit, a first output node coupled to a control electrode of the first transistor, a first control node coupled to the second input/output node of the first latch circuit, and a second control node coupled to the second input/output node of the first latch circuit; and
a control circuit supplying a first signal to a control electrode of the second transistor, a second signal to control electrodes of the third and fourth transistors, and a third signal to a control electrode of the sixth transistor.

2. The device as claimed in claim 1, wherein each of the first, second and third signals changes between the second potential and a third potential, the third potential being smaller than the first potential.

3. The device as claimed in claim 2, wherein the first transistor is of a first channel type and each of the second to sixth transistors is of a second channel type.

4. The device as claimed in claim 1, wherein the first gate circuit comprises seventh and eighth transistors coupled in parallel between the first input node and the first output node, gate electrodes of the seventh and eighth transistors being coupled to the first and second control nodes, respectively.

5. The device as claimed in claim 4, wherein each of the first and seventh transistors is of a first channel type and each of the second, third, fourth, fifth, sixth and eighth transistors is of a second channel type.

6. The device as claimed in claim 1,
wherein the write circuit further comprises,
a seventh transistor coupled between the first potential line and the first terminal of the switch circuit,
eighth and ninth transistors coupled in series between the fourth input/output node of the second latch circuit and the second potential line, a control gate of the eighth transistor being coupled to the second input/output node of the first latch circuit, and
a second gate circuit including a second input node coupled to the third input/output node of the second latch circuit, a second output node coupled to a control electrode of the seventh transistor, a third control node coupled to the first input/output node of the first latch circuit, and a fourth control node coupled to the second input/output node of the first latch circuit; and
wherein the control circuit further supplies a fourth signal to a control electrode of the ninth transistor.

7. The device as claimed in claim 6,
wherein the first gate circuit comprises tenth and eleventh transistors coupled in parallel between the first input node and the first output node, gate electrodes of the tenth and eleventh transistors being coupled to the first and second control nodes, respectively, and
wherein the second gate circuit comprises twelfth and thirteenth transistors coupled in parallel between the second input node and the second output node, gate electrodes of the twelfth and thirteenth transistors being coupled to the third and fourth control nodes, respectively.

8. The device as claimed in claim 7, wherein each of the first, seventh, tenth and twelfth transistors is of a first channel type and each of the second, third, fourth, fifth, sixth, eighth, ninth, eleventh and thirteenth transistors is of a second channel type.

9. The device as claimed in claim 1, wherein the first gate circuit comprises seventh and eighth transistors coupled in series between the first potential line and the first output node and ninth and tenth transistors coupled in series between the first output node and the second potential line, a control electrode of the seventh transistor being coupled to the second input/output node of the first latch circuit, control electrodes of the eighth and ninth transistors being coupled in common to the fourth input/output node of the second latch circuit, and a control electrode of the tenth transistor being coupled to the first input/output node of the first latch circuit.

10. The device as claimed in claim 9, wherein each of the first, seventh and eighth transistors is of a first channel type and each of the second, third, fourth, fifth, sixth, ninth and tenth transistors is of a second channel type.

11. The device as claimed in claim 6,
wherein the first gate circuit comprises tenth and eleventh transistors coupled in series between the first potential line and the first output node and twelfth and thirteenth transistors coupled in series between the first output node and the second potential line, a control electrode of the tenth transistor being coupled to the second input/output node of the first latch circuit, control electrodes of the eleventh and twelfth transistors being coupled in common to the fourth input/output node of the second latch circuit, and a control electrode of the thirteenth transistor being coupled to the first input/output node of the first latch circuit; and
wherein the second gate circuit comprises fourteenth and fifteenth transistors coupled in series between the first potential line and the second output node and sixteenth and seventeenth transistors coupled in series between the second output node and the second potential line, a control electrode of the fourteenth transistor being coupled to the first input/output node of the first latch circuit, control electrodes of the fifteenth and sixteenth transistors being coupled in common to the fourth input/output node of the second latch circuit, and a control electrode of the seventeenth transistor being coupled to the second input/output node of the first latch circuit.

12. The device as claimed in claim 11, wherein each of the first, seventh, tenth, eleventh, fourteenth and fifteenth transistors is of a first channel type, and each of the second, third, fourth, fifth, sixth, eighth, ninth, twelfth, thirteenth, sixteenth and seventeenth transistors is of a second channel type.

13. A device comprising:
a memory cell array including a plurality of word lines, a plurality of bit lines intersecting the word lines, and a plurality of memory cells each disposed at an associated one of intersections of the word and bit lines;
a switch circuit including a first terminal and a plurality of second terminals each coupled to an associated one of the bit lines, the switch circuit being configured to form an electrical path between the first terminal and a selected one of the second terminals;
a write circuit configured to write data into a selected one of the memory cells through the switch circuit, the write circuit comprising a first potential line supplied with a first potential, a second potential line supplied with a second potential, a plurality of P-channel transistors, and a plurality of N-channel transistors, a first one of the P-channel transistors being coupled between the first potential line and the first terminal of the switch circuit; and
a control circuit supplying first, second and third signals to the write circuit, each of the first, second and third signals changing between a third potential and the second potential, the third potential being smaller than the first potential;
wherein the N-channel transistors and remaining ones of the P-channel transistors constitute a circuit that responds to the first, second and third signals and turns the first one of the P-channel transistors ON to couple the first terminal of the switch circuit to the first potential line for a predetermined period of time, and
wherein each of the first, second and third signals is supplied to a gate electrode or gate electrodes of an associated one or associated ones of the N-channel transistors without any one of the P-channel transistors receiving at a gate electrode thereof any one of the first, second and third signals.

14. The device as claimed in claim 13, wherein each of the memory cells comprises a storage element and a cell transistor coupled in series between the an associated one of the bit lines and the second potential line, a gate electrode of the cell transistor being coupled to an associated one of the word lines.

15. The device as claimed in claim 14, wherein the storage element comprises a phase change material.

16. A device comprising:
a memory cell array including a plurality of word lines, a plurality of bit lines intersecting the word lines, and a plurality of memory cells each disposed at an associated one of intersections of the word and bit lines;

a switch circuit including a first terminal and a plurality of second terminals each coupled to an associated one of the bit lines, the switch circuit being configured to form an electrical path between the first terminal and a selected one of the second terminals;

a write circuit configured to write data into a selected one of the memory cells through the switch circuit, the write circuit comprising a first potential line supplied with a first potential, a second potential line supplied with a second potential, a plurality of first-channel-type transistors, and a plurality of second-channel-type transistors, the first-channel-type transistors including first and second transistors coupled in parallel between the first potential line and the first terminal of the switch circuit; and a control circuit supplying first, second, third and fourth signals to the write circuit, each of the first, second, third and fourth signals changing between a third potential and the second potential, the third potential being smaller than the first potential;

wherein the second-channel-type transistors and remaining ones of the first-channel-type transistors other than the first and second transistors constitute a circuit that responds to the first, second and third signals to turn the first transistor ON for a first period of time with keeping the second transistor OFF, and further responds to the first, second and fourth signals to turn the second transistor ON for a second period of time with keeping the first transistor OFF, the first period of time being different from the second period of time, and wherein each of the first, second, third and fourth signals being supplied to a gate electrode or gate electrodes of an associated one or associated ones of the second-channel-type transistors without any one of the first-channel-type transistors receiving at a gate electrode thereof any one of the first, second, third and fourth signals.

17. The device as claimed in claim 16, wherein the first-channel-type transistors are P-channel transistors and the second-channel-type transistors are N-channel transistors.

* * * * *